(12) United States Patent
Morikado

(10) Patent No.: US 8,013,382 B2
(45) Date of Patent: Sep. 6, 2011

(54) NAND FLASH MEMORY AND METHOD OF MANUFACTURING THE SAME

(75) Inventor: Mutsuo Morikado, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 225 days.

(21) Appl. No.: 12/473,968

(22) Filed: May 28, 2009

(65) Prior Publication Data

US 2009/0294829 A1     Dec. 3, 2009

(30) Foreign Application Priority Data

May 28, 2008   (JP) ................................. 2008-139576

(51) Int. Cl.
*H01L 29/788* (2006.01)
(52) U.S. Cl. ......................... 257/319; 257/321; 438/257
(58) Field of Classification Search .................. 257/316, 257/319, 321, E29.304; 438/257, 258, 264
See application file for complete search history.

(56) References Cited

U.S. PATENT DOCUMENTS

| 7,015,550 B2 | 3/2006 | Sugimae et al. |
| 7,078,763 B2 | 7/2006 | Arai et al. |
| 2009/0294829 A1 * | 12/2009 | Morikado ..................... 257/319 |

FOREIGN PATENT DOCUMENTS

| JP | 2005-45224 A | 2/2005 |
| JP | 2006-86522 A | 3/2006 |
| WO | WO 2004/040583 A1 | 5/2004 |

* cited by examiner

*Primary Examiner* — Mark Prenty
(74) *Attorney, Agent, or Firm* — Oblon, Spivak, McClelland, Maier & Neustadt, L.L.P.

(57) ABSTRACT

A semiconductor memory in which each memory cell in a NAND flash memory includes a columnar floating gate formed on an element region with a gate insulating film interposed between the floating gate and the element region, diffusion layers formed at portions of the element region located below both sides of the floating gate, and a control gate formed so as to surround the floating gate with an IPD film interposed between the control gate and the floating gate, the IPD film formed on a side surface of the floating gate.

18 Claims, 18 Drawing Sheets

XX' Section

YY' Section

XX' Section

YY' Section

XX' Section

YY' Section

XX' Section

YY' Section

XX' Section

YY' Section

XX' Section

YY' Section

XX' Section

YY' Section

XX' Section

YY' Section

XX' Section

YY' Section

XX' Section

YY' Section

XX' Section

YY' Section

XX' Section

YY' Section

XX' Section

YY' Section

XX' Section

YY' Section

XX' Section

YY' Section

NAND FLASH MEMORY AND METHOD OF MANUFACTURING THE SAME

CROSS-REFERENCE TO RELATED APPLICATIONS

This application is based upon and claims the benefit of priority from the prior Japanese Patent Application No. 2008-139576, filed May 28, 2008, the entire contents of which are incorporated herein by reference.

BACKGROUND OF THE INVENTION

1. Field of the Invention

The present invention relates to a NAND flash memory including a memory cell including control gates on both sides of a floating gate with IPD layers interposed between the control gate and the floating gate respectively, and to a method of manufacturing the same.

2. Discussion of the Background

NAND flash memories have been increasingly miniaturized in recent years. Along with the advancement of the miniaturization, it is difficult for a background memory cell of a laminated polysilicon type to ensure a high coupling ratio because of an effect of parasitic capacitance as expressed by the following formulae (1) to (3).

Here, a correlation among a capacitance Cox, a film thickness tox, and an area Sox of a tunnel oxide film is expressed by the formula (1), in which $\epsilon$ is permittivity.

$$Cox = \epsilon Sox/tox \quad (1)$$

Meanwhile, a correlation among a capacitance Cipd, a capacitance thickness tipd (in terms of $SiO_2$), and an area Sipd, of a dielectric layer between two adjacent polysilicon layers (IPD) is expressed by the formula (2).

$$Cipd = \epsilon Sipd/tipd \quad (2)$$

Therefore, a coupling ratio Cr is expressed by the formula (3).

$$Cr = Cipd/(Cox + Cipd) \quad (3)$$

Here, a NAND flash memory having a cell structure in which control gates CG are arranged on both sides of a floating gate FG has been proposed in recent years (see Japanese Patent Application Publication No. 2005-45224, for example). In this NAND flash memory, a side wall of the floating gate can ensure a desired coupling ratio Cr expressed by the formula (3).

In the above-described background NAND flash memory, for example, the floating gate FG is reduced in film thickness as much as possible so that a bottom surface of the control gate CG is vertically aligned with a surface of a silicon substrate as closely as possible. In this way, a parasite capacitance between adjacent cells is reduced while the desired coupling ratio is ensured.

In the above-described background NAND flash memory, the coupling ratio Cr needs to be increased in order to achieve a wide range of threshold voltages, for example with the application of a high writing voltage Vpgm or with the reduction of the parasite capacitance between adjacent cells. In this case, a problem arises in that an electric short-circuit may occur between the control gate CG and the semiconductor (silicon) substrate (as described in Japanese Patent Application Publication No. 2005-45224, for example).

BRIEF SUMMARY OF THE INVENTION

A NAND flash memory according to an aspect of the present invention includes: an element region and a shallow trench isolation region formed in a line-and-space pattern in a semiconductor substrate; a first selection gate transistor formed on the element region, the first selection gate transistor having one end connected to a bit line; a second selection gate transistor formed on the element region, the second selection gate transistor having one end connected to a source line; and a plurality of memory cells formed on the element region of the semiconductor substrate and connected to each other in series between the other end of the first selection gate transistor and the other end of the second selection gate transistor, wherein each of the memory cells includes: a columnar floating gate formed on the element region with a gate insulating film interposed between the floating gate and the element region; diffusion layers formed at portions of the element region located below both sides of the floating gate; and a control gate formed so as to surround the floating gate with an inter-poly dielectric (IPD) film interposed between the control gate and the floating gate, the IPD film formed on a side surface of the floating gate.

A method of manufacturing of a NAND flash memory according to an aspect of the present invention includes: forming a gate insulating film on a semiconductor substrate; forming a first conductive film on the gate insulating film; etching the gate insulating film, the first conductive film, and the semiconductor substrate using a first resist pattern as a mask, so that a groove is formed in the semiconductor substrate; forming a shallow trench isolation insulating film inside the groove in a way that an upper surface of the shallow trench isolation insulating film is at a same level as an upper surface of the first conductor film; depositing an insulating film on the first conductive film and on the shallow trench isolation insulating film; depositing a second conductive film on the insulating film; etching and selectively removing the second conductive film and the insulating film using a second resist pattern as a mask so as to form a contact hole continuing to the first conductive film, the second resist pattern having an opening at a portion corresponding to a region where the floating gate is formed; forming the IPD film on an inner wall of the contact hole; forming a third conductive film inside the contact hole; and etching and selectively removing the second conductive film, the insulating film, and the first conductive film using as a mask a third resist pattern having an opening at a portion corresponding to a region where the control gate is formed.

DESCRIPTION OF PREFERRED EMBODIMENTS

According to an embodiment of the present invention, control gates (word lines) are formed so as to surround a floating gate. In this way, an effect of parasite capacitance between adjacent memory cells can be reduced and thus a side surface of the floating gate can be fully used for ensuring a coupling ratio.

Further, a bottom surface of each control gate can be placed above an upper surface of a silicon surface. Therefore, it is possible to suppress an electric short-circuit between the control gate and the silicon substrate.

Hereinbelow, embodiments of the present invention will be described with reference to the accompanying drawings.

Figure 1:
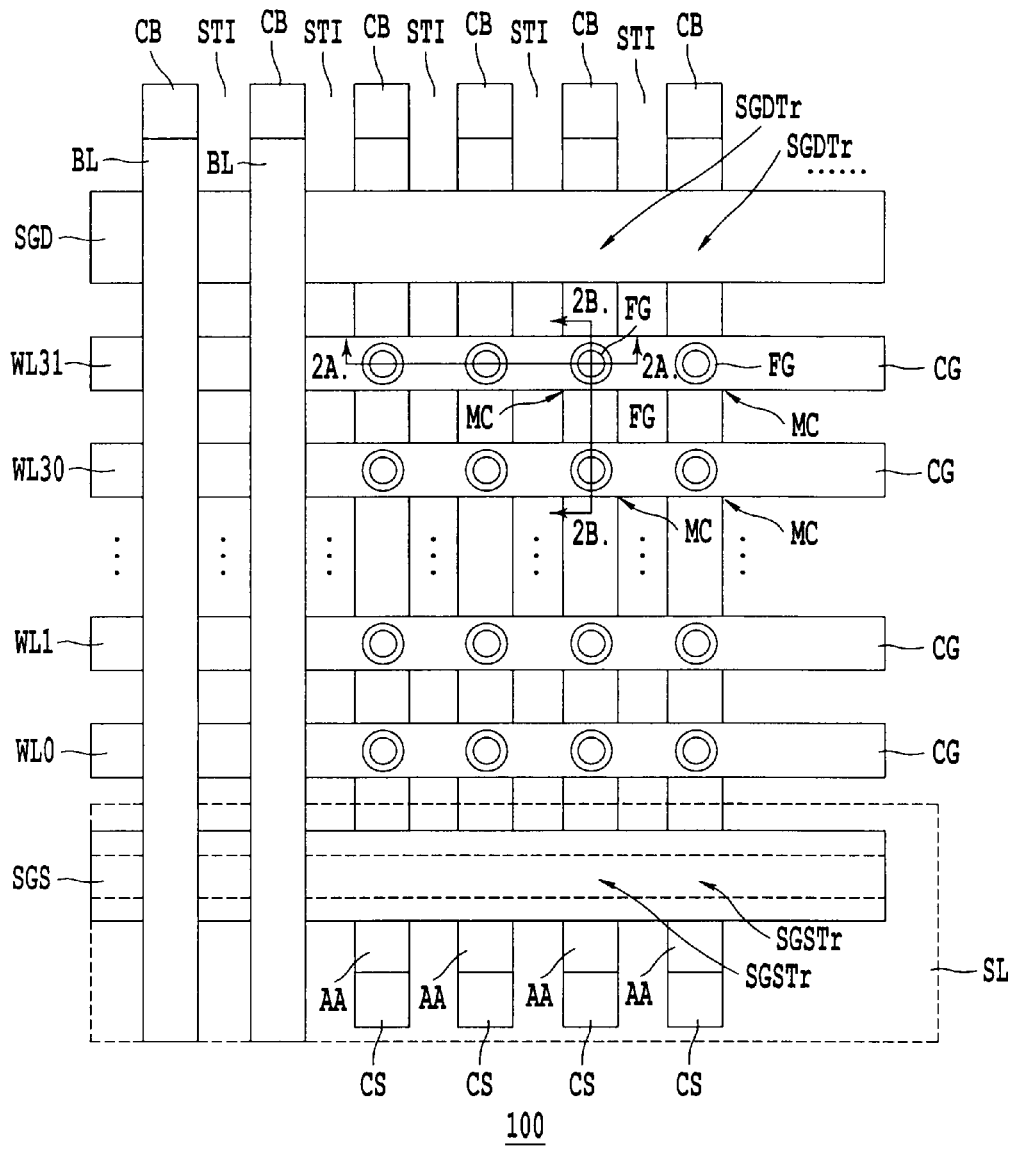
FIG. 1 is a plan view showing a schematic pattern in the vicinity of a memory cell array of a NAND flash memory 100 according to a first one of embodiments of the present invention.

FIG. 1 is a plan view showing a schematic pattern in the vicinity of a memory cell array of a NAND flash memory 100 according to a first one of embodiments of the present invention. Meanwhile, FIG. 2A is a cross-sectional view of the NAND flash memory 100 shown in FIG. 1 taken along an X-X' line. Moreover, FIG. 2B is a cross-sectional view of the NAND flash memory 100 shown in FIG. 1 taken along a Y-Y' line.

Figure 2B:
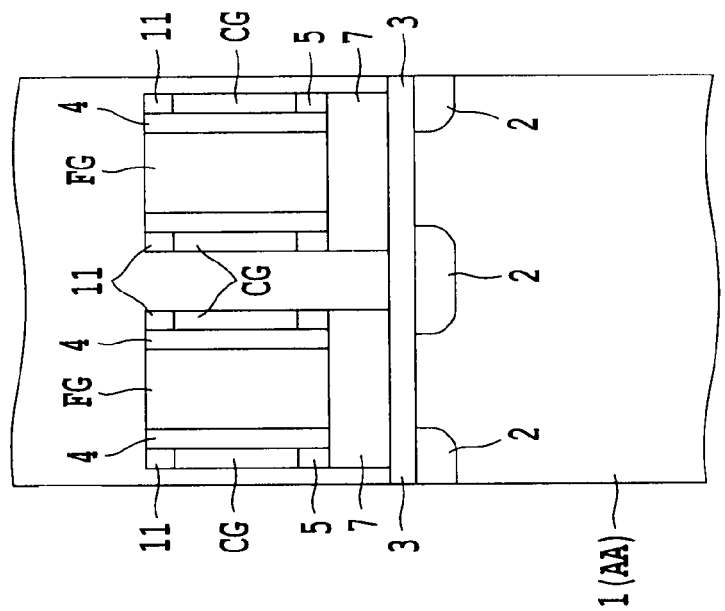
FIG. 2B is a cross-sectional view of the NAND flash memory 100 shown in FIG. 1 taken along a Y-Y' line.
Figure 2A:
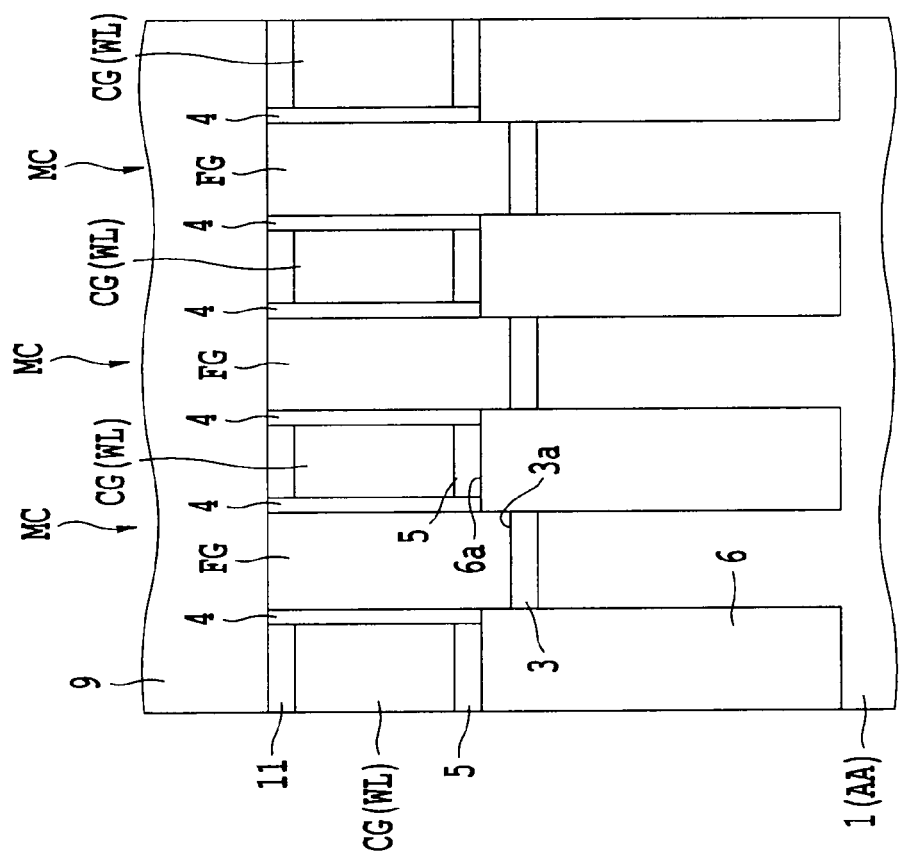
FIG. 2A is a cross-sectional view of the NAND flash memory 100 shown in FIG. 1 taken along an X-X' line.

As shown in FIG. 1, FIG. 2A, and FIG. 2B, in a memory cell region of the NAND flash memory 100, element regions AA and shallow trench isolation (STI) regions extending in a longitudinal direction in the drawings are formed in a line-and-space pattern on a silicon substrate 1 serving as a semiconductor substrate.

The NAND flash memory 100 includes selection gate transistors SGDTr and SGSTr, and memory cells MC.

The selection gate transistors SGDTr are formed on the element region AA and one end (a drain) thereof is connected to a bit line BL. The selection gate transistors SGSTr are formed on the element region AA and one end (a source) thereof is connected to a source line SL.

Control gates CG and selection gates SGD and SGS extending in a lateral direction in FIG. 1 are formed in the NAND flash memory 100. For example, two selection gates (SGD and SGS) are formed every 32 control gates CG (word lines WL).

The selection gate SGD, a diffusion layer formed on the element region AA, and a gate insulating film 3 together form the selection gate transistor SGDTr. The selection gate SGS, the diffusion layer formed on the element region AA, and the gate insulating film 3 together form the selection gate transistor SGSTr.

A plurality of the memory cells MC are formed on the element regions AA. The plurality of the memory cells are connected in series between the other end (a source) of the selection gate transistor SGDTr and the other end (a drain) of the selection gate transistor SGSTr. Each of the memory cells MC includes a diffusion layer, the gate insulating film (a tunnel oxide film) 3, a floating gate FG, an IPD film 4, and the control gate CG (the word line WL).

The diffusion layers 2 are formed at portions of the element region AA located below both sides of the floating gate FG.

The floating gate FG has a columnar shape (a cylindrical shape here) formed on the element region AA with the gate insulating film 3 interposed between the floating gate FG and the element region AA.

The control gate CG (the word line WL) is formed so as to surround the floating gate FG with the IPD film 4, interposed between the control gate CG and the floating gate FG, that is formed on side surfaces of the floating gate FG. In this way, the control gate, functioning as a shield, can reduce an effect of interference between the adjacent memory cells MC. This control gate CG is formed to extend between the adjacent element regions AA continuously (i.e., between adjacent shallow trench isolation insulating films 6 of the shallow trench isolation (STI) regions). A SiN film 5 is formed to extend between the control gate CG and the shallow trench isolation insulating film 6 continuously.

Moreover, an upper surface 6a of the shallow trench isolation insulating film 6 is designed to be located higher than an upper surface 3a of the gate insulating film 3.

In this way, it is possible to suppress leak current between the control gate CG (the word line WL) and the silicon substrate 1 (or to improve breakdown voltage) as compared to the related art. Accordingly, it is possible to operate the NAND flash memory 100 more stably.

A bit line contact CB is connected between the bit line BL and the element region AA (the drain of the transistor of the selection gate SGD).

A source line contact CS is connected between the source line BL and the element region AA (the source of the transistor of the selection gate SGS).

The adjacent control gates CG (the word lines WL) of memory cells MC are insulated from each other by an interlayer insulating film 9.

Now, a method of manufacturing the NAND flash memory 100 having the above-described configuration will be described.

FIGS. 3A, 4A, 5A, 6A, 7A, 8A, 9A, and 10A are cross-sectional views of a memory cell array in respective steps of a method of manufacturing the NAND flash memory 100 shown in FIG. 1, which are respectively taken along the X-X' line. Meanwhile, FIGS. 3B, 4B, 5B, 6B, 7B, 8B, 9B, and 10B are cross-sectional views of the memory cell array in the respective steps of the method of manufacturing the NAND flash memory 100 shown in FIG. 1, which are respectively taken along the Y—Y' line.

Wells and channels are formed on the semiconductor substrate 1 by doping.

Figure 3A:
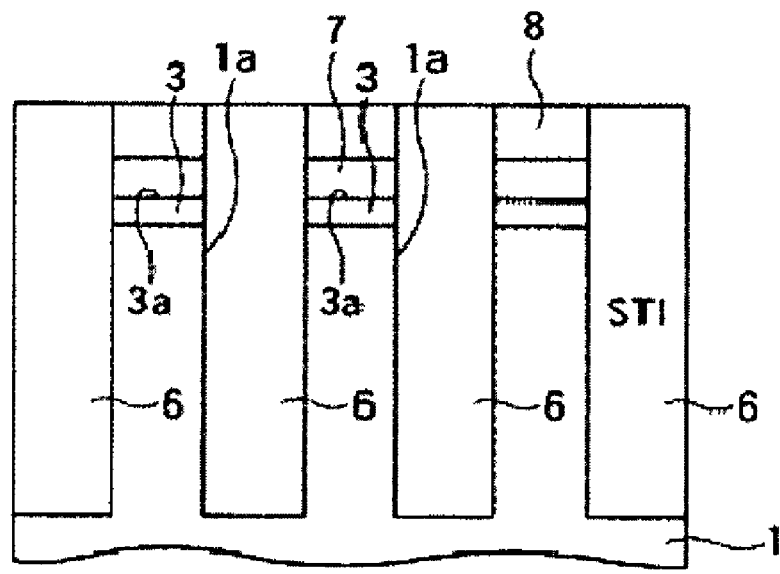
FIG. 3A is a cross-sectional view of a memory cell array in a step of a method of manufacturing the NAND flash memory 100 shown in FIG. 1, which is taken along the X-X' line.
Figure 3B:
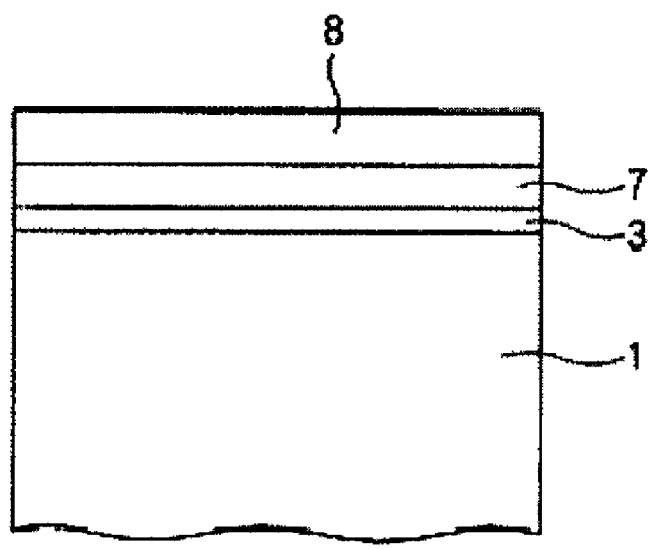
FIG. 3B is a cross-sectional view of the memory cell array in the step of the method of manufacturing the NAND flash memory 100 shown in FIG. 1, which is taken along the Y-Y' line.

As shown in FIGS. 3A, 3B, a thermal oxide film, for example ($SiO_2$), serving as the gate insulating film 3 is formed on the silicon substrate 1. Here, the thickness of the thermal oxide film in a region to which a high voltage applied at the time of programming and erasing is applied is set to approximately 35 nm, for example. On the other hand, the thickness of the thermal oxide film in a region to which the high voltage is not applied is set to approximately 8 nm, for example.

Further, an interface between Si and $SiO_2$ is nitrided. Thereafter, polysilicon, a conductive film serving as the floating gates FG, is deposited in a thickness of about 30 nm, for example, to form a polysilicon film 7 on the thermal oxide film 3.

A SiN film 8 is deposited in a thickness of about 70 nm, for example, on the entire surface of the polysilicon film 7. Then, a desired resist pattern (not shown) is formed on the SiN film 8 in order to form the element regions AA. Thereafter, the SiN film 8, the polysilicon film 7, the gate insulating film 3, and the silicon substrate 1 are sequentially etched by using the resist pattern as a mask, thereby forming grooves la having a desired depth on the silicon substrate 1.

After removing the remaining resist pattern, a $SiO_2$ film is deposited into the grooves la formed on the silicon substrate 1 with a plasma method until burying the SiN film 8. Here, after removing the remaining resist pattern, the exposed surface of the silicon substrate 1 may be oxidized in an amount of about 2 nm by a thermal oxidation method.

The $SiO_2$ film is flashed by a chemical mechanical polishing (CMP) method to expose the remaining SiN film 8 on the silicon substrate 1. In this way, as shown in FIGS. 3A and 3B, the shallow trench isolation insulating film 6 is formed. As a result, element region AA is formed in the silicon substrate (1) between the trench isolation insulating film 6 (STI) at the cross-sectional view of X-X line.

Figure 4A:
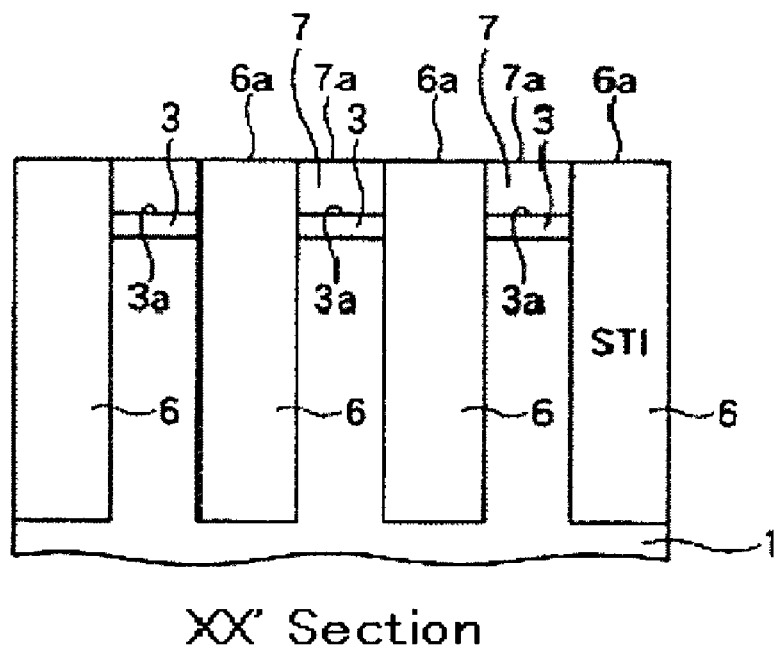
FIG. 4A is a cross-sectional view of the memory cell array of a step subsequent to FIG. 3A of the method of manufacturing the NAND flash memory 100 shown in FIG. 1, which is taken along the X-X' line.
Figure 4B:
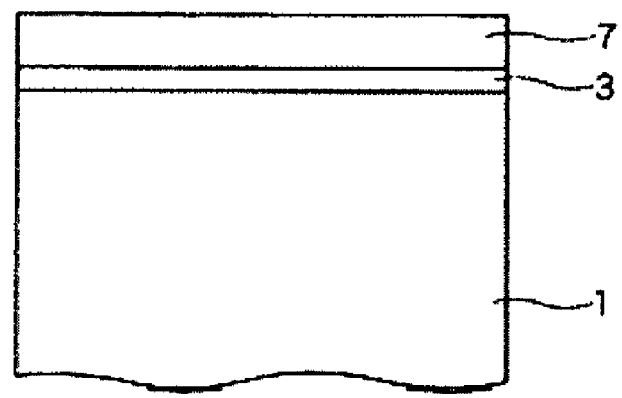
FIG. 4B is a cross-sectional view of the memory cell array in the step subsequent to FIG. 3B of the method of manufacturing the NAND flash memory 100 shown in FIG. 1, which is taken along the Y-Y' line.

After forming the shallow trench isolation insulating film 6, as shown in FIGS. 4A and 4B, the $SiO_2$ film buried in the grooves la is etched and removed to reach an interface between the polysilicon film 7 and the SiN film 8 by a reactive ion etching (RIE) method using the remaining SiN film 8 as a mask. In this way, the upper surface 6a of the shallow trench isolation insulating film 6 is adjusted to be on the same level of the upper surface of the polysilicon film 7. Further, the remaining SiN film 8 is removed by use of a $H_3PO_4$ liquid, for example. In this way, the upper surface 6a of the shallow trench isolation insulating film 6 is located higher than the upper surface 3a of the gate insulating film 3.

Figure 5A:
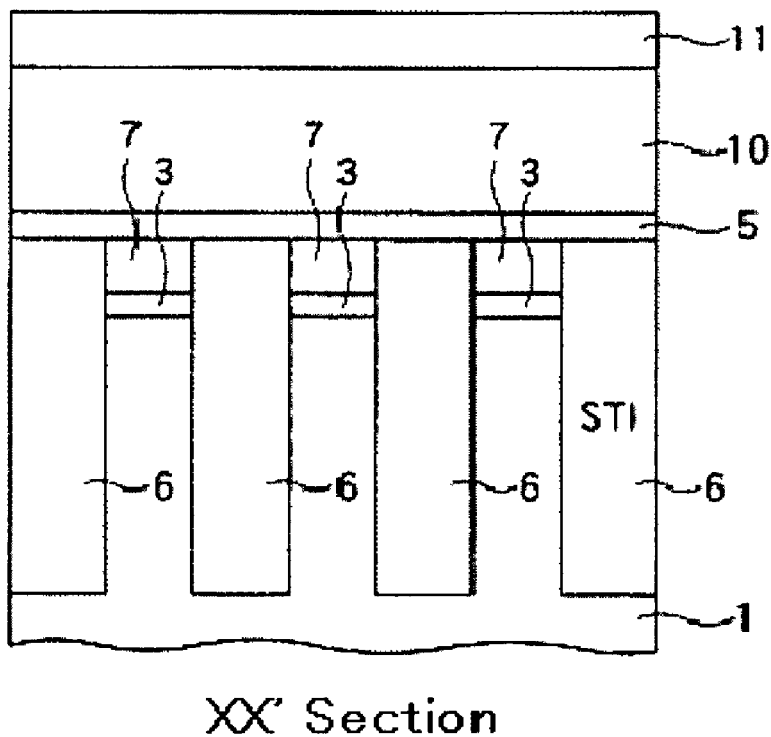
FIG. 5A is a cross-sectional view of the memory cell array of a step subsequent to FIG. 4A of the method of manufacturing the NAND flash memory 100 shown in FIG. 1, which is taken along the X-X' line.
Figure 5B:
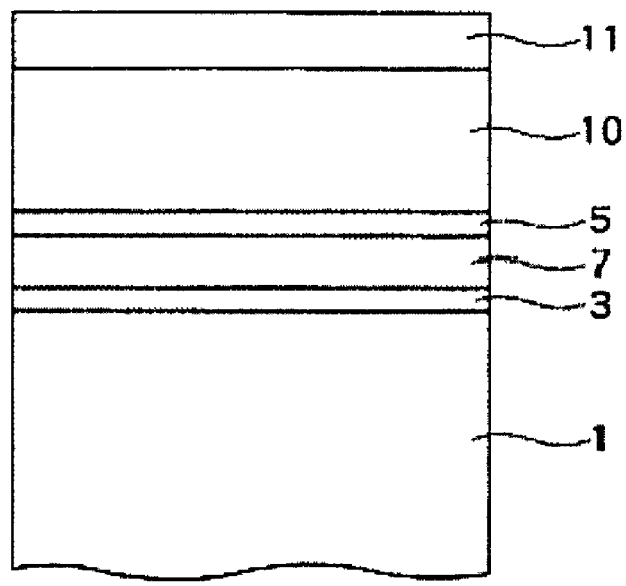
FIG. 5B is a cross-sectional view of the memory cell array in the step subsequent to FIG. 4B of the method of manufacturing the NAND flash memory 100 shown in FIG. 1, which is taken along the Y-Y' line.

As shown in FIGS. 5A and 5B, a silicon nitride film (SiN film) 5 serving as an insulating film is deposited on the silicon substrate 1 (i.e., on the polysilicon film 7 and on the shallow trench isolation insulating film 6). Further, polysilicon is deposited on the SiN film 5 to form a polysilicon film 10 that constitutes the control gates CG. Moreover, a SiN film 11 is deposited on this polysilicon film 10.

Figure 6A:
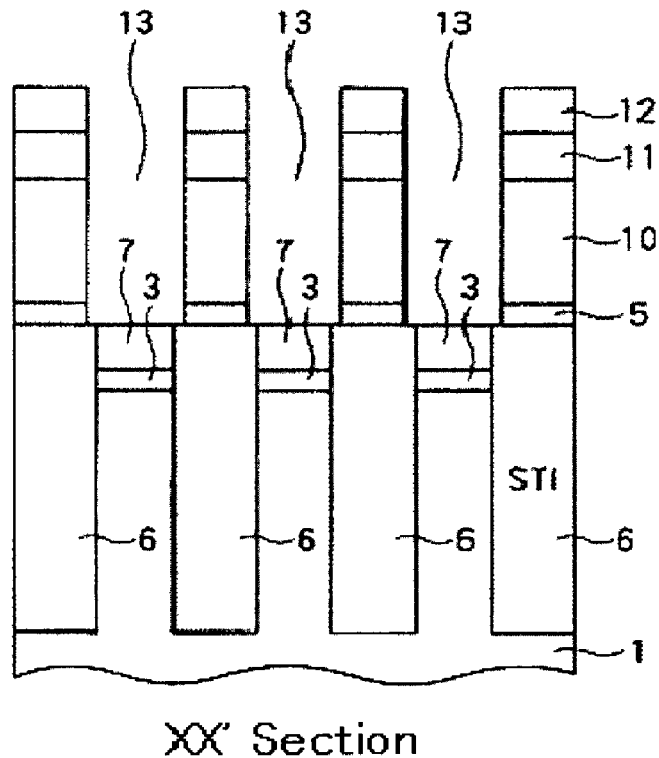
FIG. 6A is a cross-sectional view of the memory cell array of a step subsequent to FIG. 5A of the method of manufacturing the NAND flash memory 100 shown in FIG. 1, which is taken along the X-X' line.
Figure 6B:
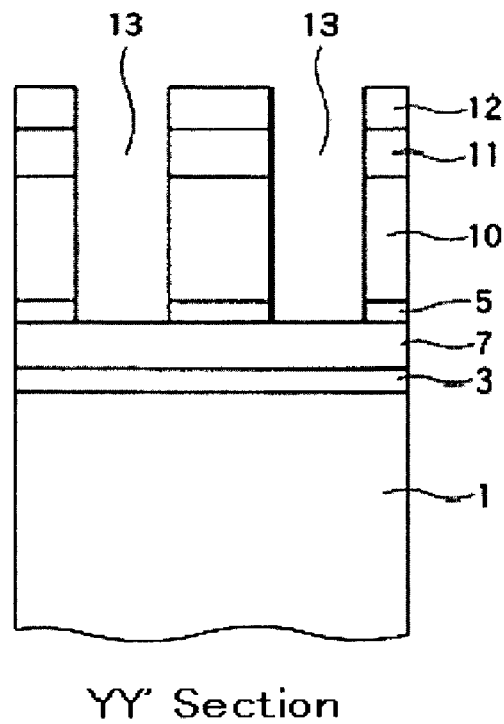
FIG. 6B is a cross-sectional view of the memory cell array in the step subsequent to FIG. 5B of the method of manufacturing the NAND flash memory 100 shown in FIG. 1, which is taken along the Y-Y' line.

As shown in FIGS. 6A and 6B, the SiN film 11, the polysilicon film 10, and the SiN film 5 are etched and selectively removed by using as a mask a resist pattern 12 having openings at portions corresponding to the regions where the floating gates FG are formed. In this way, contact holes 13 continuing to the polysilicon film 7 are formed. Here, on the silicon substrate 1, the positions and widths of the contact holes 13 are adjusted, so that the contact holes 13 substantially overlap with the preformed polysilicon film 7 in terms of the direction of the word lines WL (the direction of the X-X' line).

Figure 7A:
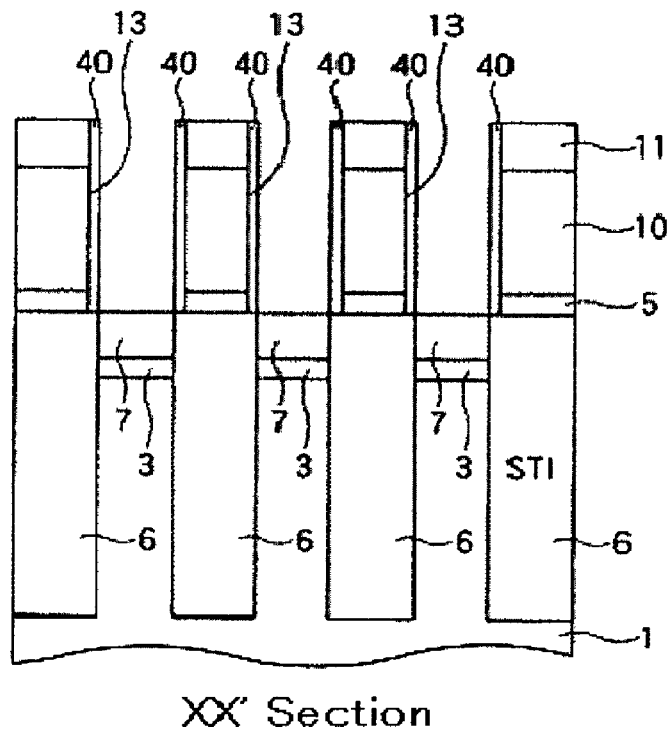
FIG. 7A is a cross-sectional view of the memory cell array of a step subsequent to FIG. 6A of the method of manufacturing the NAND flash memory 100 shown in FIG. 1, which is taken along the X-X' line.
Figure 7B:
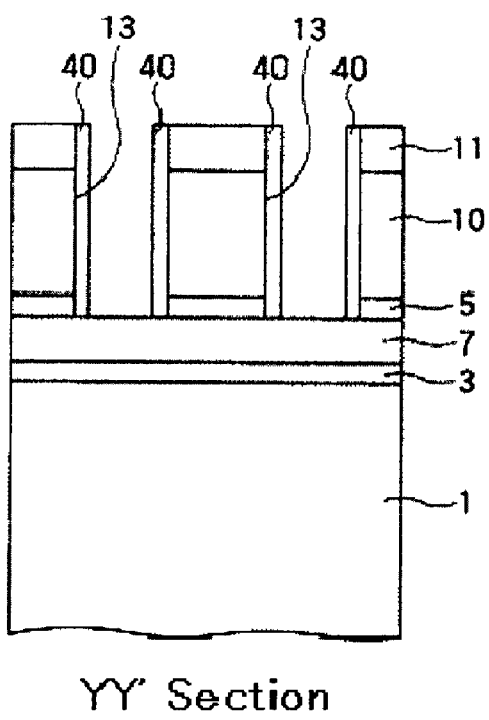
FIG. 7B is a cross-sectional view of the memory cell array in the step subsequent to FIG. 6B of the method of manufacturing the NAND flash memory 100 shown in FIG. 1, which is taken along the Y-Y' line.

As shown in FIGS. 7A and 7B, after removing the remaining resist pattern 12, a sacrificial inter-poly dielectric (IPD) film made of SiN, $Al_2O_3$ or the like, for example, is deposited on the silicon substrate 1 (i.e., on the SiN film 11 and inside the contact holes 13). Then, the sacrificial IPD film on the SiN film 11 and at bottoms of the contact holes 13 is selectively removed by the RIE method. Accordingly, the upper surface of the polysilicon film 7 is exposed. In this way, a sacrificial IPD film 40 is formed on inner walls of the contact holes 13.

Figure 8A:
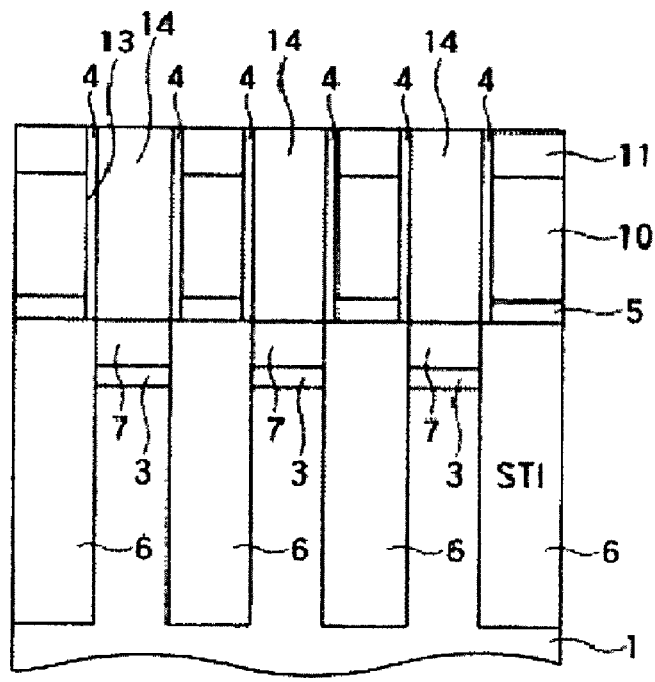
FIG. 8A is a cross-sectional view of the memory cell array of a step subsequent to FIG. 7A of the method of manufacturing the NAND flash memory 100 shown in FIG. 1, which is taken along the X-X' line.
Figure 8B:
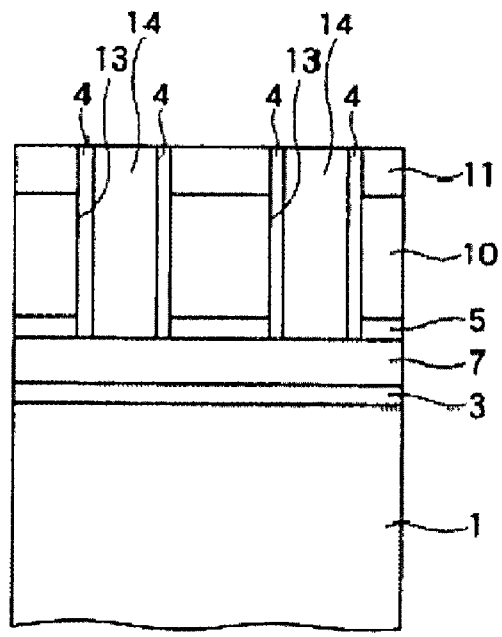
FIG. 8B is a cross-sectional view of the memory cell array in the step subsequent to FIG. 7B of the method of manufacturing the NAND flash memory 100 shown in FIG. 1, which is taken along the Y-Y' line.

As shown in FIGS. 8A and 8B, a polysilicon is deposited on the silicon substrate 1 (i.e., on the SiN film 11 and inside the contact holes 13) and then the polysilicon on the SiN film 11 is removed by the CMP method, for example. In this way, a polysilicon film 14 constituting the floating gates FG is formed. Then, the sacrificial IPD film 40 is selectively removed by wet etching. Moreover, the IPD film 4 made of a laminated film of, for example, SiN, $SiO_2$, and SiN viewed from the side surface of the floating gate FG, is formed by an atomic layer deposition (ALD) method in spaces that are formed after removing the sacrificial IPD film 40.

Here, the sacrificial IPD film 40 may not be removed, but may be used as an IPD film for the memory cells MC. In this case, the step of selectively removing the sacrificial IPD film 40 by wet etching and the step of forming the IPD film 4 by the ALD method in the spaces formed after removing the sacrificial IPD film 40 are omitted.

Figure 11:
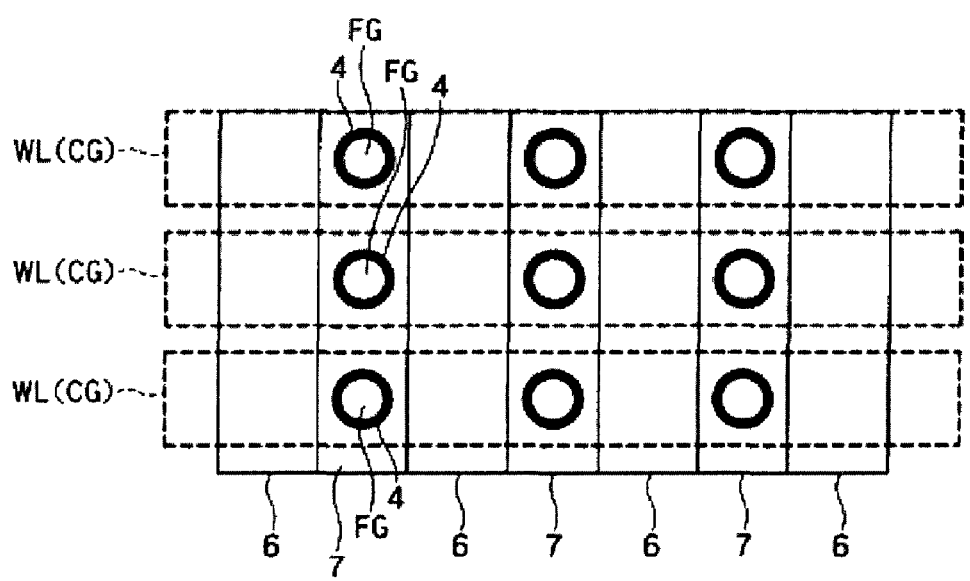
FIG. 11 is a partial plan view of the NAND flash memory 100 in the step shown in FIG. 8A and FIG. 8B.

Now, FIG. 11 is a partial plan view of the NAND flash memory 100 in the step shown in FIG. 8A and FIG. 8B. Note the SiN films 11 and 5 are not shown in FIG. 11.

As shown in FIG. 11, the control gates CG (the word lines WL) are formed so as to surround the floating gates FG with the IPD film 4, interposed between the control gates CG and the floating gates FG, formed on the side surfaces of the floating gates FG.

Figure 9A:
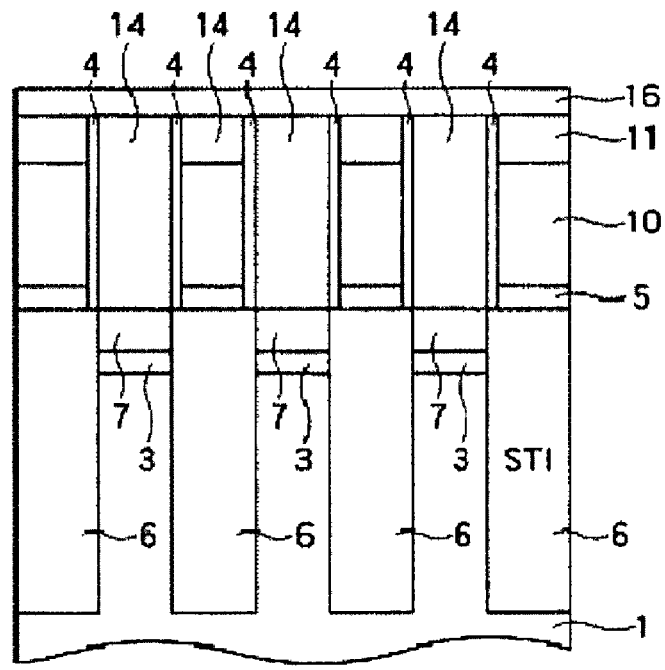
FIG. 9A is a cross-sectional view of the memory cell array of a step subsequent to FIG. 8A of the method of manufacturing the NAND flash memory 100 shown in FIG. 1, which is taken along the X-X' line.
Figure 9B:
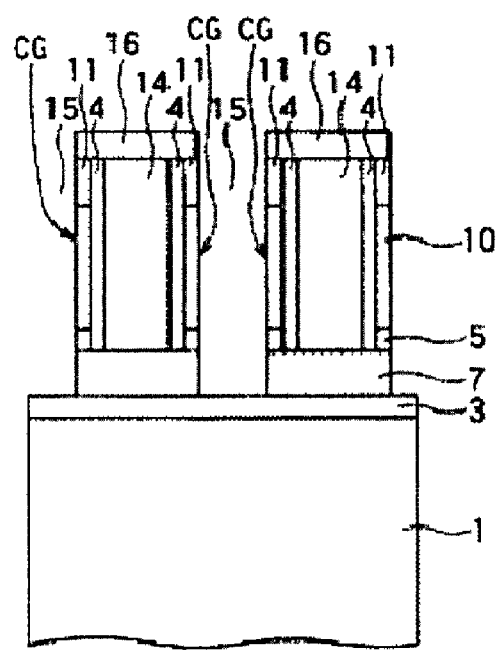
FIG. 9B is a cross-sectional view of the memory cell array in the step subsequent to FIG. 8B of the method of manufacturing the NAND flash memory 100 shown in FIG. 1, which is taken along the Y-Y' line.

Then, as shown in FIGS. 9A and 9B, after the IPD film 4 is formed by the ALD method, a desired resist pattern 16 having openings at regions is formed for patterning the control gates CG. Then, the SiN film 11, the polysilicon film 10, the silicon nitride film 5, and the polysilicon film 7 are sequentially etched and selectively removed by the RIE method using the resist pattern 16 as a mask. Hence, grooves 15 are formed.

In this way, the control gates CG are formed. Here, a diameter of each opening of the resist pattern is designed so as to allow each control gate CG to have a desired value of the film thickness in the direction of the side surface, formed on the side surfaces of the floating gates FG with the IPD film 4.

Figure 10A:
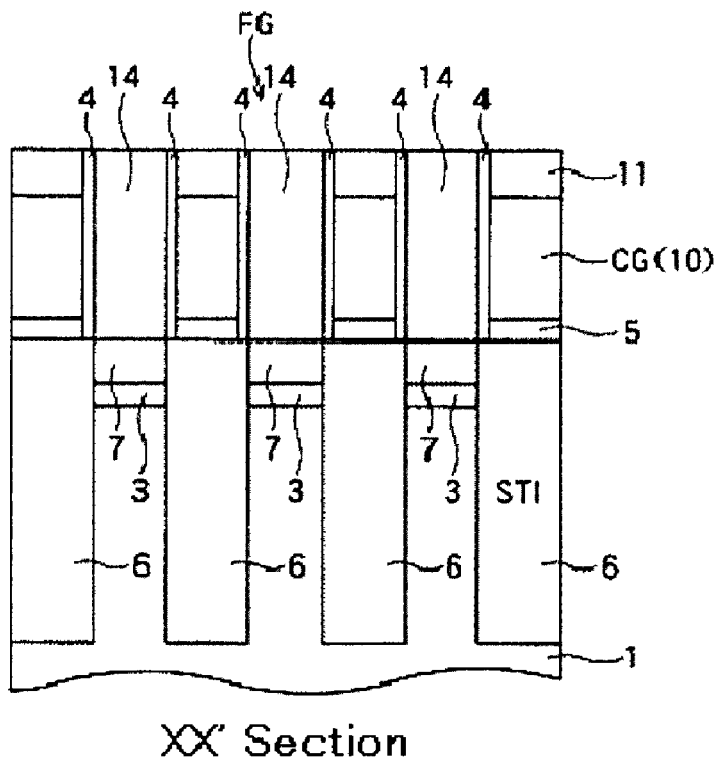
FIG. 10A is a cross-sectional view of the memory cell array of a step subsequent to FIG. 9A of the method of manufacturing the NAND flash memory 100 shown in FIG. 1, which is taken along the X-X' line.
Figure 10B:
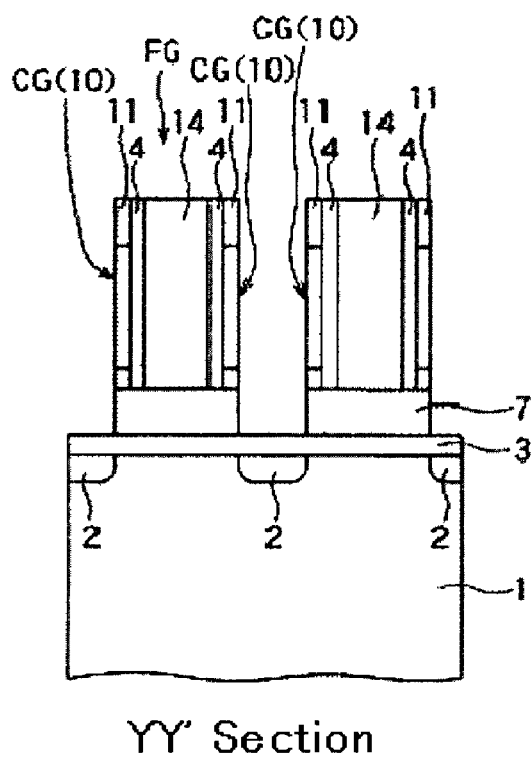
FIG. 10B is a cross-sectional view of the memory cell array in the step subsequent to FIG. 9B of the method of manufacturing the NAND flash memory 100 shown in FIG. 1, which is taken along the Y-Y' line.

Thereafter, with reference to FIGS. 10A and 10B, post oxidation of the control gates CG after the RIE is performed in the same manner as a general method of manufacturing a NAND flash memory. Then, a region having a concentration ($<10 \times 10^{19}/cm^3$) which is referred to as an extension is formed in a desired region by ion implantation in the silicon substrate 1 using a resist pattern (not shown) as a mask. Thereafter, a spacer made of an oxide film is formed inside each groove 15. Moreover, a high-concentration region referred to as a deep junction is formed by ion implantation using a resist pattern (not shown) as a mask. In this way, the diffusion layer 2 is formed.

Thereafter, a BPSG film is deposited on the silicon substrate 1 as the interlayer insulating film and then planarized. After a contact process, the memory cells MC shown in FIG. 2A and FIG. 2B are completed.

As described above, the NAND flash memory and the manufacturing method of this embodiment can reduce the effect of interference between the adjacent memory cells MC.

In the first embodiment discussed above, a description is given of a case of providing single-layer control gates.

In a second embodiment, a case where a control gate is formed of two layers is described. Note that the configuration of the NAND flash memory of the second embodiment is similar to that in the NAND flash memory 100 of the first embodiment illustrated in FIG. 1 except for the configuration of the control gates.

Figure 12A:
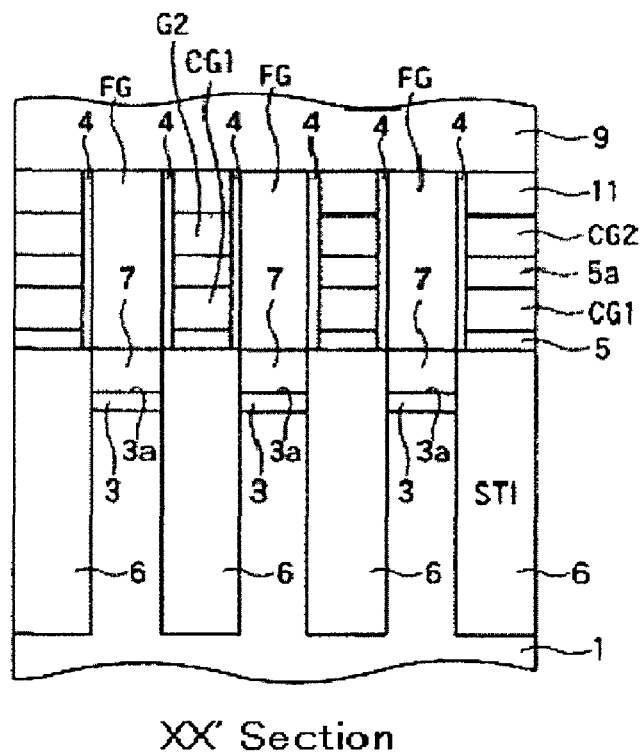
FIG. 12A is a cross-sectional view of the NAND flash memory 100 shown in FIG. 1 taken along the X-X' line.

Here, FIG. 12A is a cross-sectional view of the NAND flash memory 100 shown in FIG. 1 taken along the X-X' line. Meanwhile, FIG. 12B is a cross-sectional view of the NAND flash memory 100 shown in FIG. 1 taken along the Y-Y' line.

Figure 12B:
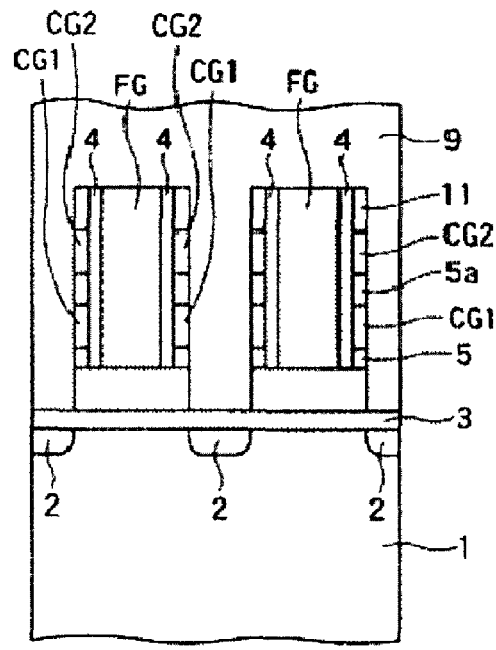
FIG. 12B is a cross-sectional view of the NAND flash memory 100 shown in FIG. 1 taken along the Y-Y' line.

As shown in FIG. 12A and FIG. 12B, each memory cell MC includes a diffusion layer 2, a gate insulating film (the tunnel oxide film)$_3$, a floating gate FG, an IPD film 4, a first control gate CG1, and a second control gate CG2.

The diffusion layers 2 are formed at portions of the element region AA located below both sides of the floating gate FG.

The floating gate FG has a columnar shape (a cylindrical shape here) formed on the element region AA with the gate insulating film 3 interposed between the floating gate FG and the element region AA.

The first control gate CG1 is formed so as to surround the floating gate FG with the IPD film 4, interposed between the first control gate CG1 and the floating gate FG, that is formed on side surfaces of the floating gate FG. In this way, the first control gate CG1, functioning as a shield, can reduce the effect of interference between the adjacent memory cells MC.

The first control gate CG1 is formed to extend between the adjacent element regions AA continuously (i.e., between adjacent shallow trench isolation insulating films 6 of the shallow trench isolation (STI) regions). The SiN film 5 is formed to extend between the first control gate CG1 and the shallow trench isolation insulating film 6 continuously.

Moreover, similar to the first embodiment, an upper surface 6a of the shallow trench isolation insulating film 6 is designed to be located higher than the upper surface 3a of the gate insulating film 3.

In this way, it is possible to suppress an electric short-circuit between the first control gate CG1 (the word line WL) and the silicon substrate 1 (or to improve breakdown voltage) as compared to the related art. Accordingly, it is possible to operate the NAND flash memory 100 more stably.

In the meantime, the second control gate CG2 is formed on the first control gate CG1 with an interlayer insulating film 5a interposed between the second control gate CG2 and the first control gate CG1 so as to surround the floating gate FG by the IPD film 4.

Different potentials may be applied to these first and second control gates CG1 and CG2.

Now, operations of the NAND flash memory 100 having the above-described configurations will be described.
(a) Programming Operation Firstly, a data write operation into the memory cell MC will be described.

In the programming operation, a write voltage Vpgm is applied between the control gate CG (a selection word line WL) and the well (the silicon substrate 1) to accumulate electric charges at the floating gate FG. This changes a threshold voltage of the memory cell MC, and thus data are written into the memory cell MC.

In this programming operation, the write voltages Vpgm are simultaneously applied to the word lines WL into which data is written, i.e., the first control gate CG1 and the second control gate CG2. Here, the write voltage Vpgm applied to the first control gate CG1 will be defined as a first write voltage Vpgm1 while the write voltage Vpgm applied to the second control gate CG2 will be defined as a second write voltage Vpgm2.

Here, the write voltages Vpgm are set such that the first write voltage Vpgm1 is not more than the second write voltage Vpgm2.

This setting can reduce the potential of the first control gate CG1 located close to the silicon substrate 1. Therefore, it is possible to improve the breakdown voltage between the silicon substrate 1 and the first control gate CG1.

In addition, it is possible to apply the higher second write voltage Vpgm2. Therefore, the high voltage can be applied to the floating gate FG between the silicon substrate 1 and the control gate so as to allow a high threshold voltage to be used for the programming operation.

Here, a pass voltage Vpass (a potential to be given to a word line WL in order to boost a channel so as to prevent programming into a non-targeted bit line BL) is applied to the word line WL into which data is not programming by operations of a background NAND flash memory, for example.

Accordingly, the write voltage Vpgm is applied between the control gate CG (the selection word line WL) and the well (the silicon substrate 1) to accumulate the electric charges at the floating gate FG. This increases the threshold voltage of the memory cell MC (i.e., the write operation is completed).

(b) Read Operation

Next, a read operation will be described. Although a normal read operation will be described herein, a verify-read operation is made in the same manner.

A read voltage Vread is applied to the first and second control gates CG1 and CG2 except to the word lines WL from which data is not read. Meanwhile, a first gate potential VCG1 is applied to the first control gate CG1 of the word line WL from which data is read while a second gate a potential VCG2 is applied to the second control gate CG2 of the word line WL from which data is read. In this case, it is also possible to set the first gate potential VCG1 to be not more than the second gate potential VCG2.

For example, the first gate potential VCG1 may be set to be equal to 0 V (the ground potential). Then, the effect of interference between adjacent memory cells is prevented. In this way, it is possible to perform biasing by setting the gate potential VCG equal to 0 V.

Alternatively, the voltages to be applied to the first and second control gates CG1 and CG2 may be adjusted appropriately to make a coupling ratio Cr_program at the time of the writing operation different from a coupling ratio Cr_read at the time of the reading operation. This is the case of applying the voltages to both of the control gates CG1 and CG2 at the time of the programming operation while applying the voltage only to the CG2 at the time of reading, for example. Specifically, the voltages to be applied to the first and second control gates CG1 and CG2 are respectively set to 14 V and 20 V, for example, and a threshold of the memory cell MC is set to 1 V (for writing) at the programming operation. At the time of reading, the first control gate CG1 is set to 0 V while the second control gate CG2 is set to 3 V. Here, if an area of IPD film 4 with which the first control gate is in contact is the same as an area of IPD film 4 with which the second control gate is in contact, the write voltage is calculated as Vpgm=1/2*(VCG1+VGC2)=17 V. Meanwhile, the read voltage is calculated as Vread=1/2*(VCG1+VCG2)=1.5 V.

For example, even after 3 V is applied to the second control gate CG2, the read voltage turns out to be 1.5 V. In other words, it is possible to say that the coupling ratio Cr_read at the time of the read operation is not more than the coupling ratio Cr_program at the time of the programming operation. It is therefore possible to read small charges in the floating gate FG as a large difference in the threshold voltage.

In short, it is possible to provide a highly reliable NAND flash memory.

Here, in a verify-read operation, a bit line control circuit (not shown) senses the potential on the bit line BL corresponding to a magnitude relation between the threshold voltage and the read voltage (a verify voltage) of the memory cell MC, and latches data corresponding to a result of sensing. Then, the data from the unshown bit line control circuit are inputted to a verification circuit (not shown). Thereafter, the verification circuit verifies whether or not the threshold voltage reaches a verification level (whether the data are written) based on the data.

(c) Erase Operation

Lastly, an erase operation will be described. This erase operation is performed in a similar manner to an erase operation of a conventional NAND flash memory. For example, the potential on all of the word lines WL (the first and second control gates CG1 and CG2) in the memory cell array block is set to 0 V and an erase voltage Vera is applied to the silicon substrate (the wells) 1. As a consequence, the charges are released from the floating gates FG to substrate 1. In this way, the threshold voltage of the memory cells MC are decreased (i.e., the erase operation is completed).

Here, a method of manufacturing the NAND flash memory 100 having the above-described configuration and functions will be described.

Note that the method of manufacturing the NAND flash memory 100 of the second embodiment has similar steps to the first embodiment illustrated in FIG. 3A to FIG. 4B.

FIGS. 13A, 14A, 15A, 16A, 17A, and 18A are cross-sectional views of the memory cell array in respective steps of the method of manufacturing the NAND flash memory 100 shown in FIG. 1, which are respectively taken along the X-X' line. Meanwhile, FIGS. 13B, 14B, 15B, 16B, 17B, and 18B are cross-sectional views of the memory cell array in the respective steps of the method of manufacturing the NAND flash memory 100 shown in FIG. 1, which are respectively taken along the Y-Y' line. Note that the same reference numerals as those in the first embodiment represent the same configurations as described in conjunction with the second embodiment in the cross-sectional views.

Figure 13A:
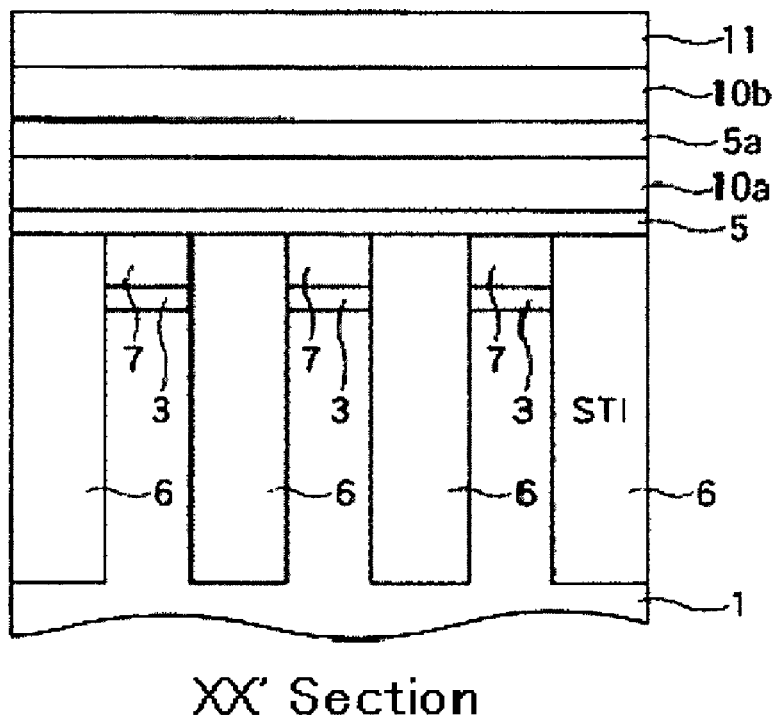
FIG. 13A is a cross-sectional view of a memory cell array in a step of a method of manufacturing the NAND flash memory 100 shown in FIG. 1, which is taken along the X-X' line.
Figure 13B:
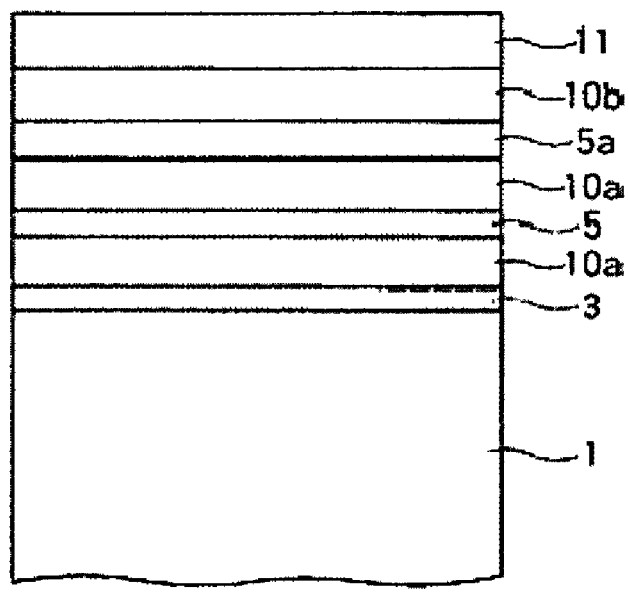
FIG. 13B is a cross-sectional view of the memory cell array in the step of the method of manufacturing the NAND flash memory 100 shown in FIG. 1, which is taken along the Y-Y' line.

After the step shown in FIG. 4A and FIG. 4B, and as shown in FIGS. 13A and 13B, the silicon nitride film (SiN film) 5 serving as the insulating film is deposited on the silicon substrate 1 (i.e., on the polysilicon film 7 and on the shallow trench isolation insulating film 6). Further, polysilicon is deposited in a thickness of 100 nm, for example, on the silicon nitride film 5 to form a polysilicon film 10a that constitutes the first control gates CG1. Thereafter, an insulating film such as an oxide film (SiO$_2$) 5a is deposited on this polysilicon film 10a. Further, polysilicon is deposited in a thickness of 100 nm, for example, on the oxide film 5a to form a polysilicon film 10b as the second control gates CG2. Moreover, the SiN film 11, for example, is deposited on the polysilicon film 10b.

Figure 14A:
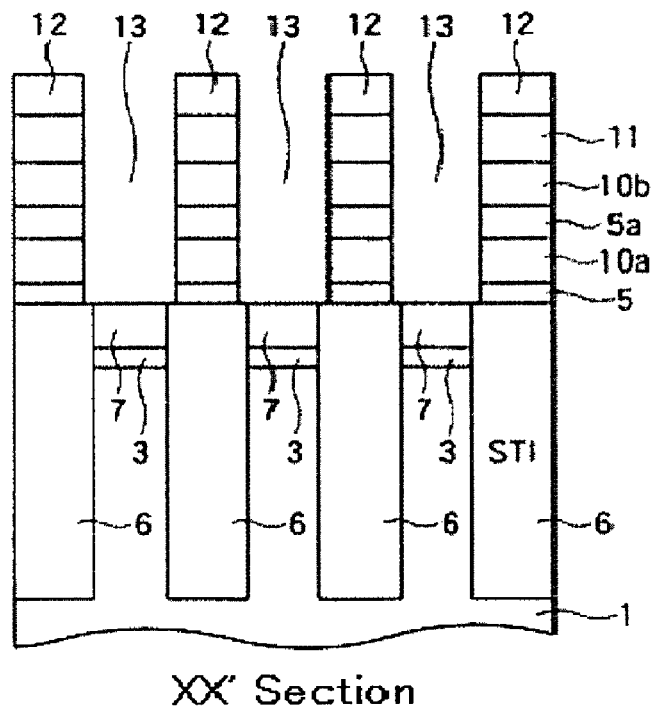
FIG. 14A is a cross-sectional view of the memory cell array of a step subsequent to FIG. 13A of the method of manufacturing the NAND flash memory 100 shown in FIG. 1, which is taken along the X-X' line.
Figure 14B:
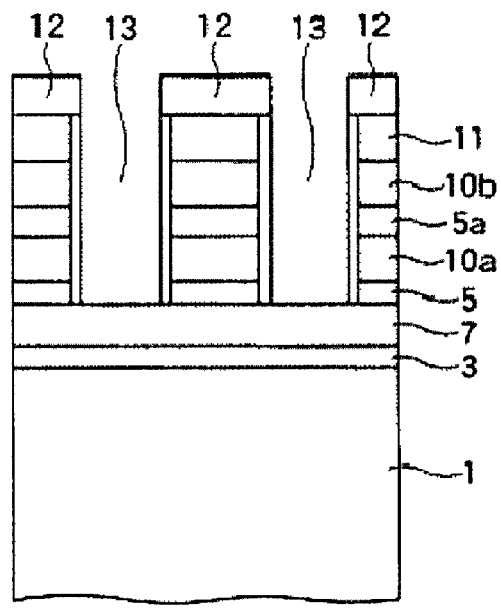
FIG. 14B is a cross-sectional view of the memory cell array in the step subsequent to FIG. 13B of the method of manufacturing the NAND flash memory 100 shown in FIG. 1, which is taken along the Y-Y' line.

As shown in FIGS. 14A and 14B, the SiN film 11, the polysilicon film 10b, the oxide film 5a, the polysilicon film 10a, and the SiN film 5 are etched and selectively removed by using as a mask the resist pattern 12 having openings at portions corresponding to the regions where the floating gates FG are formed. In this way, the contact holes 13 continuing to the polysilicon film 7 are formed. Here, on the silicon substrate 1, the positions and widths of the contact holes 13 are adjusted, so that the contact holes 13 substantially overlap with the preformed polysilicon film 7 in terms of the direction of the word lines WL (the direction of the X-X' line).

Figure 15A:
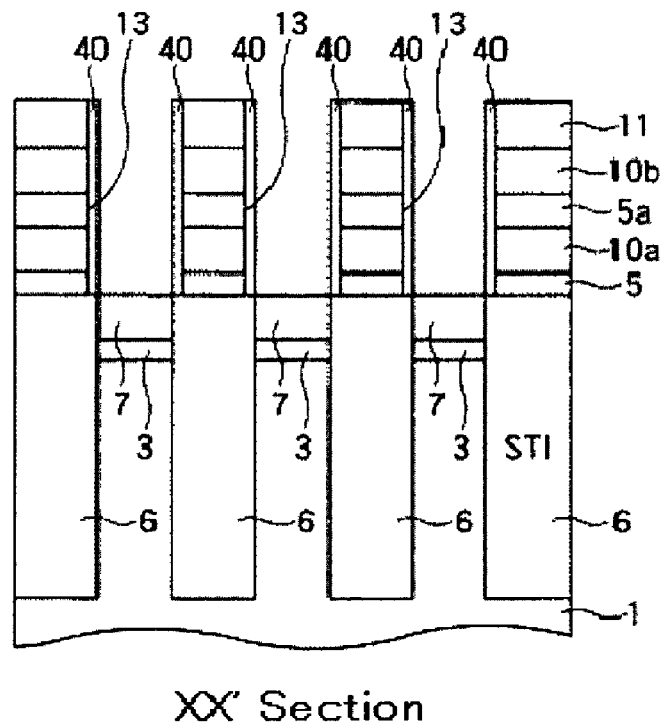
FIG. 15A is a cross-sectional view of the memory cell array of a step subsequent to FIG. 14A of the method of manufacturing the NAND flash memory 100 shown in FIG. 1, which is taken along the X-X' line.
Figure 15B:
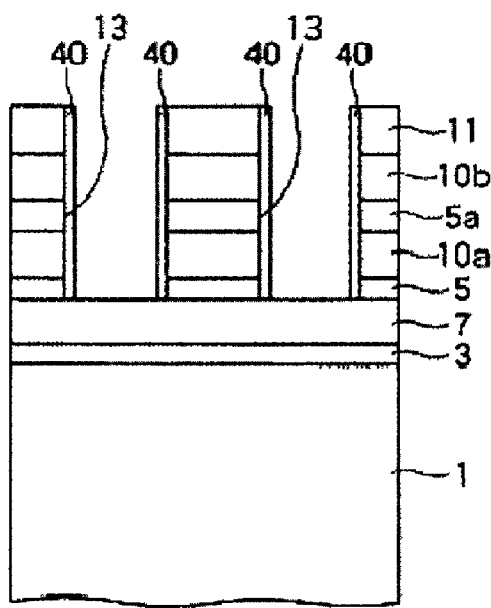
FIG. 15B is a cross-sectional view of the memory cell array in the step subsequent to FIG. 14B of the method of manufacturing the NAND flash memory 100 shown in FIG. 1, which is taken along the Y-Y' line.

As shown in FIGS. 15A and 15B, after removing the remaining resist pattern 12, the sacrificial IPD film made of SiN, $Al_2O_3$ or the like, for example, is deposited on the silicon substrate 1 (i.e., on the SiN film 11 and inside the contact holes 13). Then, the sacrificial IPD film on the SiN film 11 and at bottoms of the contact holes 13 is selectively removed by the RIE method. Accordingly, the upper surface of the polysilicon film 7 is exposed. In this way, the sacrificial IPD film 40 is formed on the inner walls of the contact holes 13.

Figure 16A:
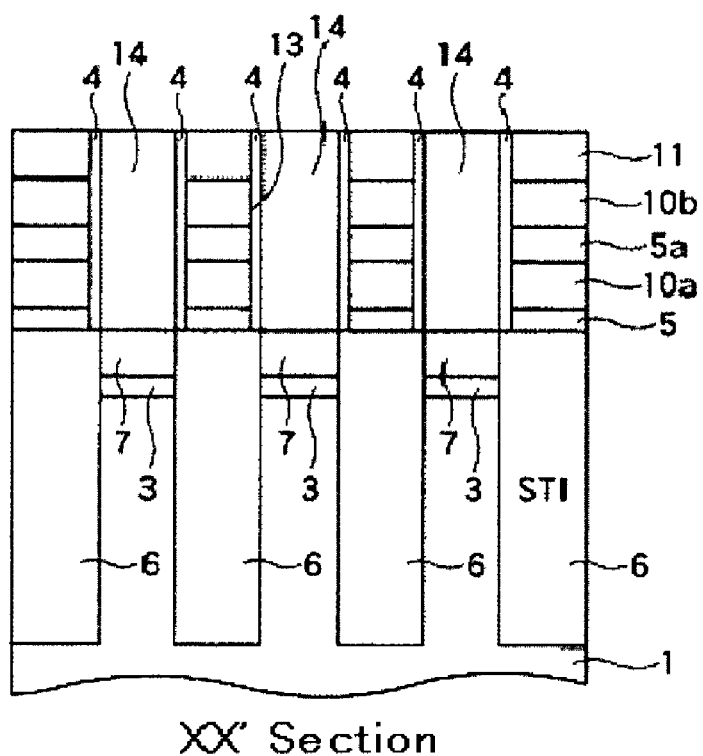
FIG. 16A is a cross-sectional view of the memory cell array of a step subsequent to FIG. 15A of the method of manufacturing the NAND flash memory 100 shown in FIG. 1, which is taken along the X-X' line.
Figure 16B:
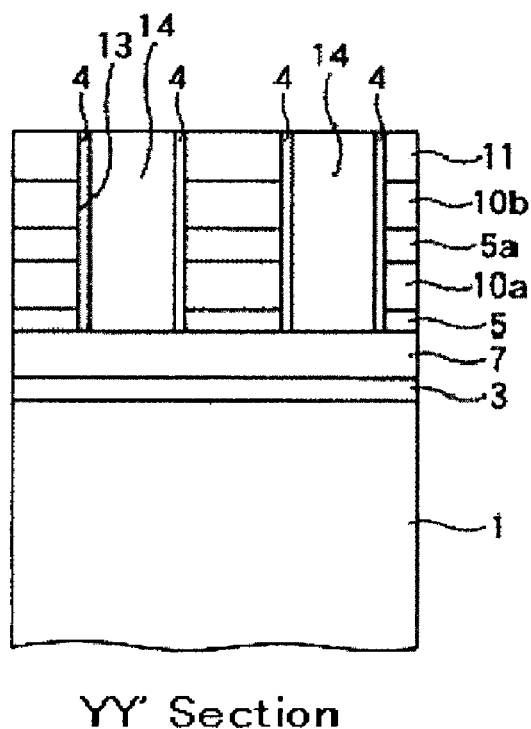
FIG. 16B is a cross-sectional view of the memory cell array in the step subsequent to FIG. 15B of the method of manufacturing the NAND flash memory 100 shown in FIG. 1, which is taken along the Y-Y' line.

As shown in FIGS. 16A and 16B, a polysilicon is deposited on the silicon substrate 1 (i.e., on the SiN film 11 and inside the contact holes 13) and then the polysilicon on the SiN film 11 is removed by the CMP method, for example. In this way, the polysilicon film 14 as the floating gates FG is formed. Then, the sacrificial IPD film 40 is selectively removed by wet etching. Moreover, the IPD film 4 is formed by the ALD method in the spaces that are formed after removing the sacrificial IPD film 40.

Here, similar to the first embodiment, the first and second control gates CG1 and CG2 (the word lines WL) are formed so as to surround the floating gates FG with the IPD film 4 interposed between the first and second control gates CG1, CG2 and the floating gates FG, formed on the side surfaces of the floating gates FG.

Also similar to the first embodiment, the sacrificial IPD film 40 may not be removed, but be used as an IPD film for the memory cells MC. In this case, the step of selectively removing the sacrificial IPD film 40 by wet etching and the step of forming the IPD film 4 by the ALD method in the spaces formed after removing the sacrificial IPD film 40 are omitted.

Figure 17A:
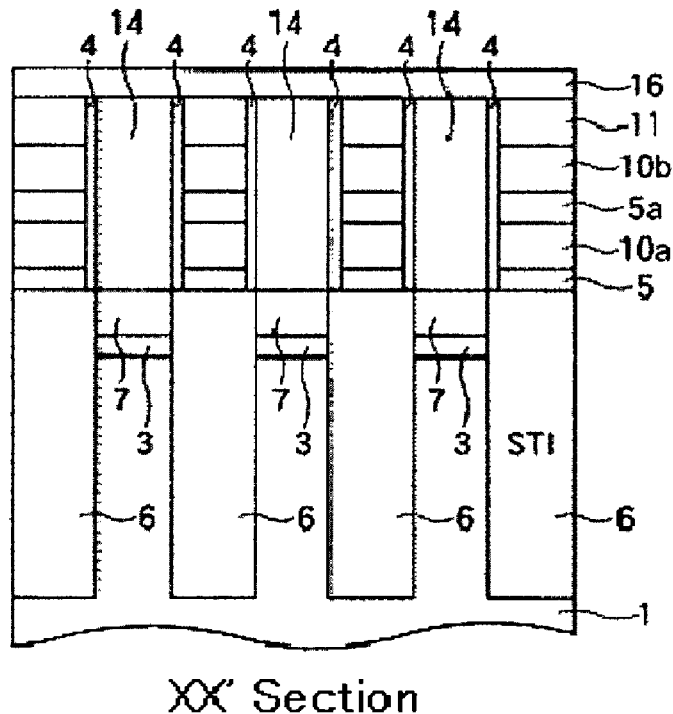
FIG. 17A is a cross-sectional view of the memory cell array of a step subsequent to FIG. 16A of the method of manufacturing the NAND flash memory 100 shown in FIG. 1, which is taken along the X-X' line.
Figure 17B:
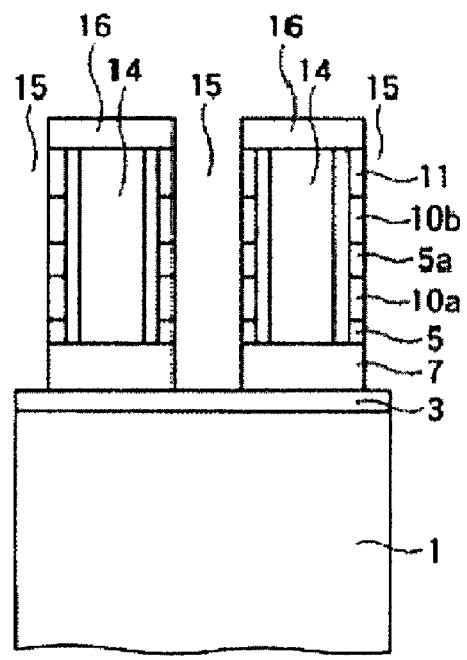
FIG. 17B is a cross-sectional view of the memory cell array in the step subsequent to FIG. 16B of the method of manufacturing the NAND flash memory 100 shown in FIG. 1, which is taken along the Y-Y' line.

Then, as shown in FIGS. 17A and 17B, after the IPD film 4 is formed by the ALD method, a desired resist pattern 16 having openings at regions is formed for patterning the first and second control gates CG1 and CG2. Then, the SiN film 11, the polysilicon film 10, the SiN film 5, and the polysilicon film 7 are sequentially etched and selectively removed by the RIE method using the resist pattern 16 as a mask. Hence, the grooves 15 are formed. Thereafter, the resist pattern 16 is removed.

In this way, the first and second control gates CG1 and CG2 are formed. Here, a diameter of each opening of the—resist pattern is designed so as to allow each of the first and second control gates CG1 and CG2 to have a desired value of the film thickness.

Figure 18A:
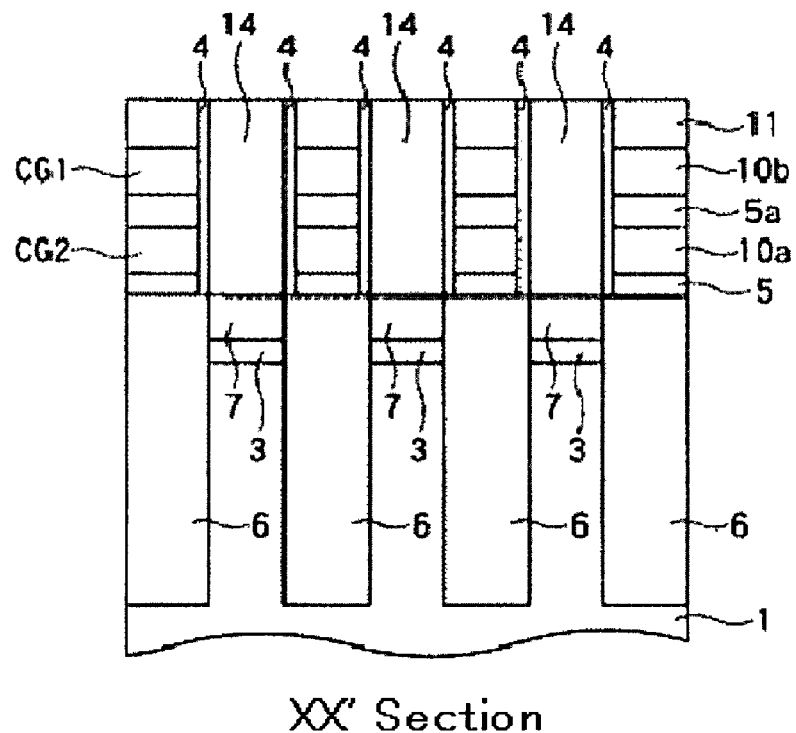
FIG. 18A is a cross-sectional view of the memory cell array of a step subsequent to FIG. 17A of the method of manufacturing the NAND flash memory 100 shown in FIG. 1, which is taken along the X-X' line.
Figure 18B:
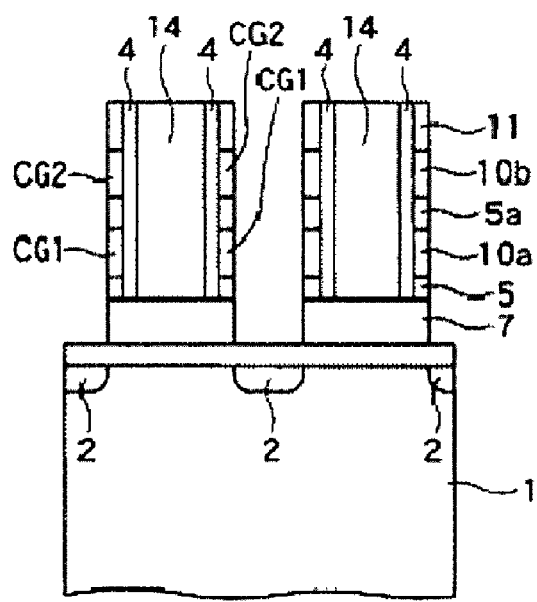
FIG. 18B is a cross-sectional view of the memory cell array in the step subsequent to FIG. 17B of the method of manufacturing the NAND flash memory 100 shown in FIG. 1, which is taken along the Y-Y' line.

Thereafter, with reference to FIGS. 18A and 18B, the post oxidation of the control gates CG after the RIE is performed in the same manner as a general method of manufacturing a NAND flash memory. Then, a region having a concentration ($<10\times10^{19}/cm^3$) which is referred to as an extension is formed in a desired region by ion implantation in the silicon substrate 1 using a resist pattern (not shown) as a mask. Thereafter, the spacer made of an oxide film is formed inside each groove 15. Moreover, a high-concentration region referred to as a deep junction is formed by ion implantation using a resist pattern (not shown) as a mask. In this way, the diffusion layer 2 is formed.

Thereafter, the BPSG film is deposited on the silicon substrate 1 as the interlayer insulating film and then planarized.

After the contact process, the memory cells MC shown in FIG. 12A and FIG. 12B are completed.

As described previously, according to the present embodiment, the control gates are stacked with each other in the vertical direction, and the two control gates drive one memory cell MC. In this way, it is possible to prevent an electric short-circuit between the silicon substrate and the control gate, to increase the coupling ratio, to reduce the write voltage Vpgm, and to ensure a sufficient operating margin.

In this way, the NAND flash memory and the manufacturing method according to the present embodiment can reduce the effect of interference between the adjacent memory cells MC.

Obviously, numerous modifications and variations of the present invention are possible in light of the above teachings. It is therefore to be understood that within the scope of the appended claims, the invention may be practiced otherwise than as specifically described herein.

The invention claimed is:
1. A NAND flash memory comprising:
an element region and a shallow trench isolation region are formed in a line-and-space pattern in a semiconductor substrate;
a first selection gate transistor formed on the element region, the first selection gate transistor having one end connected to a bit line;
a second selection gate transistor formed on the element region, the second selection gate transistor having one end connected to a source line; and
a plurality of memory cells formed on the element region of the semiconductor substrate and connected to each other in series between the other end of the first selection gate transistor and the other end of the second selection gate transistor, wherein each of the memory cells includes:
a columnar floating gate formed on the element region with a gate insulating film interposed between the floating gate and the element region;
diffusion layers formed at portions of the element region located below both sides of the floating gate; and
a control gate formed so as to surround the floating gate with an inter-poly dielectric (IPD) film interposed between the control gate and the floating gate, the IPD film formed on a side surface of the floating gate.
2. The NAND flash memory according to claim 1, wherein the control gate is formed to extend continuously between element regions that are adjacent to each other, and
an upper surface of a shallow trench isolation insulating film of the shallow trench isolation region is located higher than an upper surface of the gate insulating film.
3. The NAND flash memory according to claim 1, wherein the columnar floating gate includes a first portion and a second portion, and
the IPD film is formed on a side surface of the second portion.
4. The NAND flash memory according to claim 3, wherein the second portion is narrower than the first portion in a direction in which the memory cells are connected to each other in series.
5. The NAND flash memory according to claim 3, wherein an upper surface of the first portion is at a same level as an upper surface of a shallow trench isolation insulating film of the shallow trench isolation region.
6. The NAND flash memory according to claim 1, wherein a width of the control gate is smaller than a width of the IPD film in a height direction.

7. The NAND flash memory according to claim 1, wherein
a width of the control gate is larger than a width of the floating gate in a direction in which the element region is arranged adjacent to the shallow trench isolation region.

8. A NAND flash memory comprising:
an element region and a shallow trench isolation region formed in a line-and-space pattern in a semiconductor substrate;
a first selection gate transistor formed on the element region the first selection gate transistor having one end connected to a bit line;
a second selection gate transistor formed on the element region, the second selection gate transistor having one end connected to a source line; and
a plurality of memory cells formed on the element region of the semiconductor substrate and connected to each other in series between the other end of the first selection gate transistor and the other end of the second selection gate transistor, wherein
each of the memory cells includes:
a columnar floating gate formed on the element region with a gate insulating film interposed between the floating gate and the element region;
diffusion layers formed at portions of the element region located below both sides of the floating gate;
a first control gate formed so as to surround the floating gate with an IPD film interposed between the first control gate and the floating gate, the IPD film formed on a side surface of the floating gate; and
a second control gate formed on the first control gate with an interlayer insulating film interposed in between in a manner that the second control gate surrounds the floating gate with the IPD film interposed between the second control gate and the floating gate.

9. The NAND flash memory according to claim 8, wherein
each of the first control gate and the second control gate is formed to extend continuously between element regions that are adjacent to each other, and
an upper surface of a shallow trench isolation insulating film of the shallow trench isolation region is located higher than an upper surface of the gate insulating film.

10. The NAND flash memory according to claim 8, wherein
a first potential applied the first control gate is not more than a second potential applied the second control gate at programming operation, a read operation, and a verify-read operation.

11. The NAND flash memory according to claim 10, wherein
the first potential is a ground potential at the read operation and the verify-read operation.

12. The NAND flash memory according to claim 8, wherein
the columnar floating gate includes a first portion and a second portion, and
the IPD film is formed only on a side surface of the second portion.

13. The NAND flash memory according to claim 12, wherein
the second portion is narrower than the first portion in a direction in which the memory cells are connected to each other in series.

14. The NAND flash memory according to claim 12, wherein
an upper surface of the first portion is at a same level as an upper surface of a shallow trench isolation insulating film of the shallow trench isolation region.

15. The NAND flash memory according to claim 8, wherein
a width of the control gate is smaller than a width of the IPD film in a height direction.

16. The NAND flash memory according to claim 8, wherein
a width of each of the first control gate and the second control gate is larger than a width of the floating gate in a direction in which the element region is arranged adjacent to the shallow trench isolation region.

17. A method of manufacturing a NAND flash memory comprising
forming a gate insulating film on a semiconductor substrate; forming a first conductive film on the gate insulating film;
etching the gate insulating film, the first conductive film, and the
semiconductor substrate using a first resist pattern as a mask, so that a groove is formed in the semiconductor substrate;
forming a shallow trench isolation insulating film inside the groove such that an upper surface of the shallow trench isolation insulating film is at a same level as an upper surface of the first conductor film;
depositing an insulating film on the first conductive film and on the shallow trench isolation insulating film;
depositing a second conductive film on the insulating film;
etching and selectively removing the second conductive film and the insulating film using a second resist pattern as a mask so as to form a contact hole continuing to the first conductive film, the second resist pattern having an opening at a portion corresponding to a region where a floating gate is formed;
forming a IPD film on an inner wall of the contact hole;
forming a third conductive film inside the contact hole; and
etching and selectively removing the second conductive film, the insulating film and the first conductive film using as a mask a third resist pattern having an opening at a portion corresponding to a region where a control gate is not formed.

18. The method of manufacturing a NAND flash memory according to claim 17, wherein
the opening of the second resist pattern is in a circular shape.

* * * * *